US008031821B1

(12) United States Patent
Cho et al.

(10) Patent No.: US 8,031,821 B1
(45) Date of Patent: *Oct. 4, 2011

(54) DIGITALLY ASSISTED POWER REDUCTION TECHNIQUE FOR IQ PIPELINE ADCS USED IN WIRELESS RECEIVERS

(75) Inventors: Thomas B Cho, Fremont, CA (US); Yungping Hsu, Saratoga, CA (US)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 12/907,842

(22) Filed: Oct. 19, 2010

Related U.S. Application Data

(63) Continuation of application No. 11/504,523, filed on Aug. 15, 2006, now Pat. No. 7,822,160.

(60) Provisional application No. 60/764,988, filed on Feb. 3, 2006.

(51) Int. Cl.
*H04L 7/00* (2006.01)
(52) U.S. Cl. .......... 375/355; 375/316; 341/172
(58) Field of Classification Search ............. 375/355, 375/316, 245; 341/143, 161
See application file for complete search history.

(56) References Cited

U.S. PATENT DOCUMENTS

| 7,809,088 | B2* | 10/2010 | Zerbe et al. ............... 375/320 |
|---|---|---|---|
| 2002/0138540 | A1* | 9/2002 | Enam ............... 708/835 |
| 2002/0140589 | A1* | 10/2002 | Bazarjani ............... 341/143 |
| 2002/0152084 | A1* | 10/2002 | Main ............... 704/500 |
| 2004/0046684 | A1 | 3/2004 | Cusinato |
| 2004/0125008 | A1 | 7/2004 | Yamaji |
| 2005/0093726 | A1 | 5/2005 | Hezar et al. |
| 2005/0242982 | A1 | 11/2005 | Hughes |
| 2006/0109153 | A1* | 5/2006 | Gupta ............... 341/143 |
| 2007/0001891 | A1 | 1/2007 | Mazhar |
| 2007/0035432 | A1 | 2/2007 | Gulati et al. |
| 2007/0052574 | A1* | 3/2007 | Sutardja ............... 341/161 |
| 2008/0211706 | A1* | 9/2008 | Sutardja ............... 341/172 |

OTHER PUBLICATIONS

IEEE Std 802.11h—2003 (Amendment to IEEE Std 802.11, 1999 Edition (Reaff2003)); as amended by IEEE Stds 802.11 a-1999, 802.11 b 1999, 802.11 b-1999/Cor Jan. 2001, 802.11d-2001, and 802,11g-2003; IEEE Standard for Information technology—Telecommunications and information exchange between systems—Local and metropolitan area networks—Specific requirements—Part 11: Wireless LAN . . . Transmit Power Management Extensions in the 5 GHz band in Europe; IEEE Computer Society LAN/MAN Standards Committee; Oct. 14, 2003; 74 pages.

Tarighat, Alireza et al; Compensation Schemes and Performance Analysis of IQ Imbalances in OFDM Receivers; IEEE Transactions on Signal Processing, vol. 53, No. 8, Aug. 2005; pp. 3257-3268.

(Continued)

*Primary Examiner* — Emmanuel Bayard

(57) ABSTRACT

A pipelined analog to digital converter that includes a first stage and a second stage. The first stage is configured to (i) receive a first phase component and a second phase component and (ii) generate a first integrated component and a second integrated component. The second stage is configured to sample and integrate the first integrated component and the second integrated component. The first stage is configured to: sample the first phase component to generate a first sampled component; sample the second phase component to generate a second sampled component; during a first portion of a first clock phase, (i) sample the first phase component and (ii) integrate the second sampled component to generate the second integrated component; and during a second portion of the first clock phase, (i) sample the second phase component and (ii) integrate the first sampled component to generate the first integrated component.

20 Claims, 14 Drawing Sheets

OTHER PUBLICATIONS

ANSI/IEEE Std. 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 528 pages.

IEEE Std 802.11a-1999 (Supplement to IEEE Std. 802.11-1999) [Adopted by ISO/IEC and redesignated as ISO/IEC8802-11: 1999/Amd 1:2000(E)]; Supplement to IEEE Standard for Information Technology—Telecommunications and information exchange between systems—Local and metropolitan area networks— Specific requirements—Part 11: Wireless LAN Medium Access Control (MAC) and Physical Layer (PHY) specifications High-speed Physical Layer in the 5GHz Band; LAN/MAN Standards Committee of the IEEE Computer Society; 91 pages.

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical layer (PHY) specifications: Higher-Speed Physical Layer extension in the 2.4 GHz Band; LAN/MAN Standards Committee of the IEEE Computer Society; Sep. 16, 1999 IEEE-SA Standards Board; 96 pages.

IEEE Std 802.11b-1999/Cor Jan. 2001 (Corrigendum to IEEE Std 802.11-1999); IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 2: Higher-Speed Physical Layer (PHY) extension in the 2.4 GHz Band—Corrigendum 1; LAN/MAN Standards Committee of the IEEE Computer Society; Nov. 7, 2001; 23 pages.

IEEE Std 802.11g/D2.8, May 2002 (Supplement to ANSI/IEEE Std 802.11, 1999 Edition) DRAFT Supplement to Standard [for] Information Technology—Telecommunications and information exchange between systems—Local and metropolitan area networks—Specific requirements—Part 11: Wireless LAN Medium Access Control (MAC) and Physical Layer (PHY) specifications: Further Higher-Speed Physical Layer Extension in the 2.4 GHz Band; LAN/MAN Standards Committee of the IEEE Computer Society; 53 pages.

IEEE P802.11g/D8,2, Apr. 2003 (Supplement to ANSI/IEEE Std 802.11-1999(Reaff 2003)); DRAFT Supplement to Standard [for] Information Technology—Telecommunications and information exchange between systems≦Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

802.11n; IEEE P802.11-04/0889r6; Wireless LANs, TGn Sync Proposal Technical Specification; 131 pages.

IEEE Std 802.16-2004 (Revision of IEEE Std 802.16/2001) IEEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

IEEE 802.20-PD-06, IEEE P 802.20 V14, Jul. 16, 2004, Draft 802.20 Permanent Document, System Requirements for IEEE 802.20 Mobile Broadband Wireless Access Systems—Version 14,23 pages.

Specification of the Bluetooth System Master Table of Contents & Compliance Requirements; Covered Core Package version: 2.0+ EDR Current Master TOC issued: Nov. 4, 2004; pp. 1-72; pp. 1-92; pp. 1-812.

* cited by examiner

DIGITALLY ASSISTED POWER REDUCTION TECHNIQUE FOR IQ PIPELINE ADCS USED IN WIRELESS RECEIVERS

CROSS-REFERENCE TO RELATED APPLICATIONS

This application is a continuation of U.S. application Ser. No. 11/504,523, filed on Aug. 15, 2006, now U.S. Pat. No. 7,822,160 which claims the benefit of U.S. Provisional Application No. 60/764,988, filed on Feb. 3, 2006. The disclosure of the above application is incorporated herein by reference in its entirety.

FIELD

The present disclosure relates to analog to digital converters.

BACKGROUND

Reducing power consumption of electronic devices has become increasingly important, particularly for battery powered devices such as laptop computers, personal digital assistants, cellular phones, MP3 players and other devices. Analog-to-digital converters (ADCs) are commonly used in these types of electronic devices to receive analog signals and to transform the received analog signals to digital signals. The ADC may be a pipelined ADC that utilizes multiple stages. Power consumption of the ADCs plays an important role in the overall power consumption of the electronic device. The demand for low power consumption is particularly important for battery operated applications.

Referring now to FIGS. 1A and 1B, the receiver may generate in-phase and quadrature components. For example, in FIG. 1A an exemplary super-heterodyne receiver 14-1 is shown. The receiver 14-1 includes an antenna 19 that is coupled to an optional RE filter 20 and a low noise amplifier 22. An output of the amplifier 22 is coupled to a first input of a mixer 24. A second input of the mixer 24 is connected to an oscillator 25, which provides a reference frequency. The mixer 24 converts radio frequency (RF) signals to intermediate frequency (IF) signals.

An output of the mixer 24 is connected to an optional IF filter 26, which has an output that is coupled to an automatic gain control amplifier (AGCA) 32. An output of the AGCA 32 is coupled to first inputs of mixers 40 and 41. A second input of the mixer 41 is coupled to an oscillator 42, which provides a reference frequency. A second input of the mixer 40 is connected to the oscillator 42 through a −90° phase shifter 43. The mixers 40 and 41 convert the IF signals to baseband (BB) signals. Outputs of the mixers 40 and 41 are coupled to BB circuits 44-1 and 44-2, respectively. The BB circuits 44-1 and 44-2 may include low pass filters (LPF) 45-1 and 45-2 and gain blocks 46-1 and 46-2, respectively, although other BB circuits may be used. Mixer 40 generates an in-phase (I) signal, which is output to a BB processor 47. The mixer 41 generates a quadrature-phase (Q) signal, which is output to the BB processor 47.

An output of the BB processor is output to analog to digital converters 48-1 and 48-2, which convert analog I and Q signals to digital I and Q signals, respectively. Outputs of the converters 48-1 and 48-2 are input to a digital signal processor 49.

Referring now to FIG. 1B, an exemplary direct receiver 14-2 is shown. The receiver 14-2 includes the antenna 19 that is coupled the optional RF filter 20 and to the low noise amplifier 22. An output of the low noise amplifier 22 is coupled to first inputs of RF to BB mixers 48 and 50. A second input of the mixer 50 is connected to oscillator 51, which provides a reference frequency. A second input of the mixer 48 is connected to the oscillator 51 through a −90° phase shifter 52. The mixer 48 outputs the I-signal to the BB circuit 44-1, which may include the LPF 45-1 and the gain block 46-1. An output of the BB circuit 44-1 is input to the 1313 processor 47. Similarly, the mixer 50 outputs the Q signal to the BB circuit 44-2, which may include the LPF 45-2 and the gain block 46-2. An output of the BB circuit 44-2 is output to the ADCs 48-1 and 48-2 and the DSP 49.

Referring now to FIG. 2, the ADCs 48-1 and 48-2 maybe pipelined ADCs. A typical pipelined ADC 55 is shown. The ADC 55 includes a plurality of stages 62-1, 62-2, and 62-3 (collectively stages 62) that are cascaded in series. Although three stages 62-1, 62-2, and 62-3 are shown, the pipelined ADC 55 may include additional or fewer stages. Some of the A/D converter stages 62 include a sample and hold module 64 that samples and holds the analog input signal Vin or the residue signal Vres from a prior stage. A low resolution A/D subconverter module 66 quantizes the held analog signal to a resolution of Bi bits where i corresponds to the current stage of the pipelined A/D converter 55. The number of bits per stage Bi and/or the number of stages may be determined in part by the desired sampling rate and resolution. The output of the A/D subconverter module 66 is supplied to a low-resolution D/A subconverter module 68 that converts the resulting digital output signal back into an analog representation.

The D/A subconverter module 68 may have a resolution that is equivalent to that of the corresponding A/D subconverter module 66 of the same stage. A difference module 70 subtracts the analog output from the D/A subconverter module 68 from the voltage input Vin to generate a residue signal Vres. The residue signal Vres is equal to the difference between the held analog signal (Vin or Vres from the prior stage) and the reconstructed analog signal.

An analog interstage gain module 72 may be used to amplify the residue signal. The amplified residue signal is output to the next stage 62-2 of the pipelined ADC 55. The first ADC stage 62-1 of the pipelined ADC 55 operates on a most current analog input sample while the second ADC stage 62-2 operates on the amplified residue of the prior input sample. The third stage 62-3 operates on the amplified residue output by the second ADC stage 62-2.

The concurrency of operations allows a conversion speed that is determined by the time it takes in one stage. Once a current stage has completed operating on the analog input sample received from the prior stage, the current stage is available to operate on the next sample.

SUMMARY

A device comprises a first circuit that generates a first phase component and a second phase component. A pipelined analog to digital converter comprises N stages, wherein N is an integer greater than one. At least one of the N stages includes a sample and integrate circuit that selectively samples the first phase component and integrates a sampled second phase component to generate an integrated second phase component during one portion of a first clock phase of the sample and integrate circuit, and that selectively integrates the sampled first phase component to generate an integrated first phase component and samples the second phase component to generate the sampled second phase component during another portion of the first clock phase of the sample and integrate circuit.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 5E is a functional block diagram of a cellular phone;

DETAILED DESCRIPTION

Figure 1A:
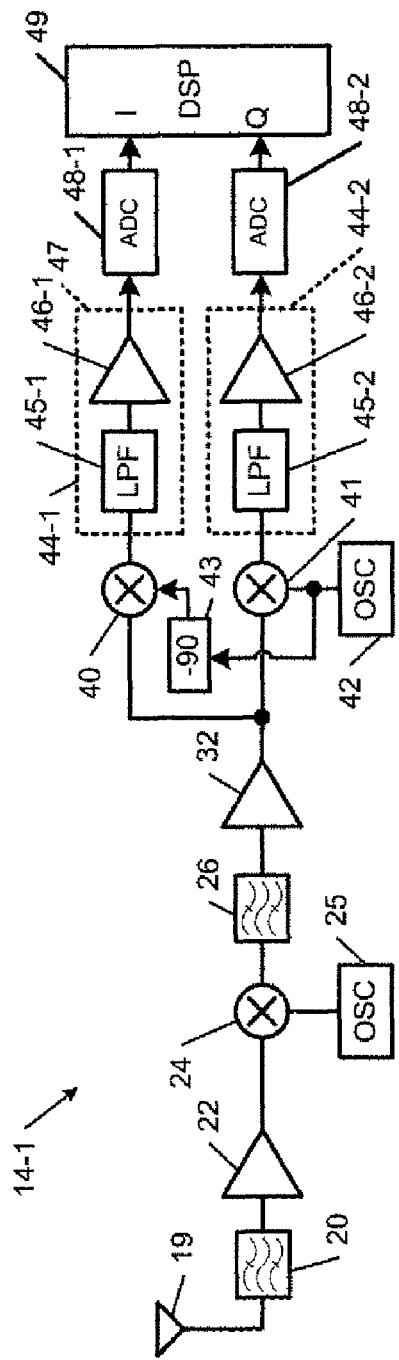
FIG. 1A is a functional block diagram of a first exemplary receiver according to the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

The present disclosure reduces power consumption of ADCs. In particular, the present disclosure shares an ADC stage with in-phase (I) and quadrature (Q) paths instead of having two separate ADCs as shown in FIG. 1. The ADC stage alternates between sampling I and integrating Q and sampling Q and integrating I. Adjacent stages use an opposite order of sampling and integrating as will be described further below.

Figure 3A:
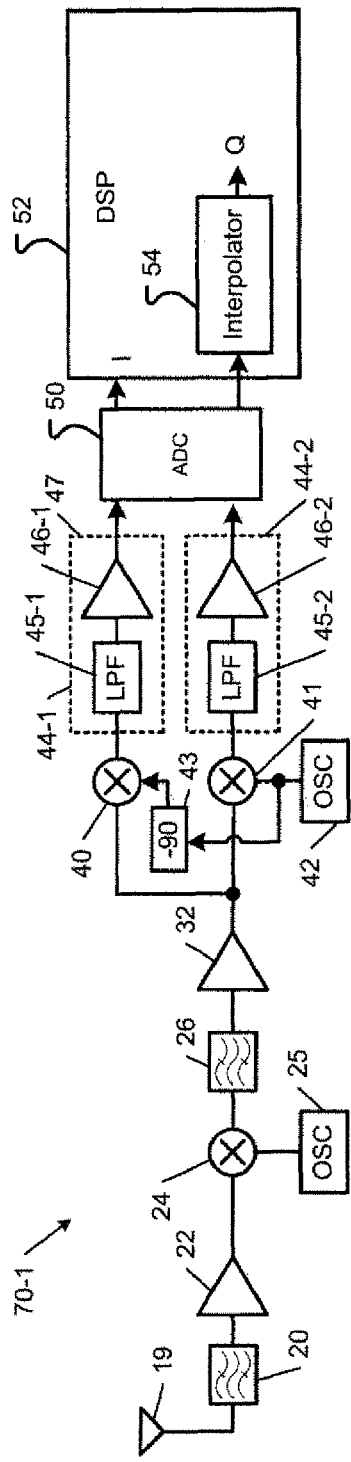
FIG. 3A is a functional block diagram of a first exemplary receiver including a digital interpolator according to the present disclosure.
Figure 3B:
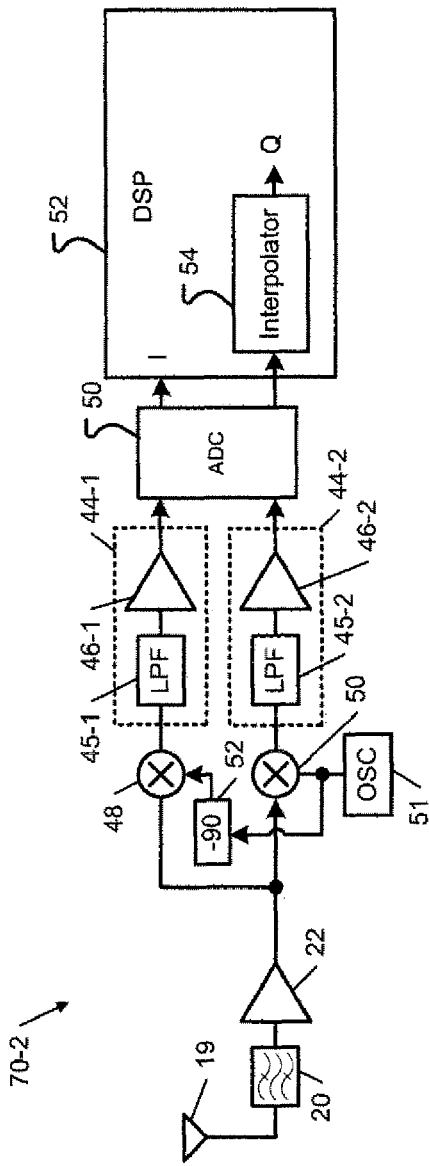
FIG. 3B is a functional block diagram of a second exemplary receiver including a digital interpolator according to the present disclosure.

Referring now to FIGS. 3A and 3B, exemplary receivers 70-1 and 70-2 according to the present disclosure are shown. The DSP 52 includes a digital interpolator circuit 54. A pipelined analog to digital converter 50 converts the I and Q signals to digital I and Q signals as will be described below. The digital I and Q signals are processed by the DSP 52 and aligned in time by the digital interpolator 54.

The interpolator 54 can be any digital filter that provides a group delay of n+½ cycles, where n is the additional delay due to the filter embodiment and can be compensated by a digital delay line or a digital filter of group delay n in the other signal path. The interpolator 54 can be any low-pass, high-pass, band-pass, or all-pass filter, as long as its passband covers the signal band of interest.

Figure 3C:
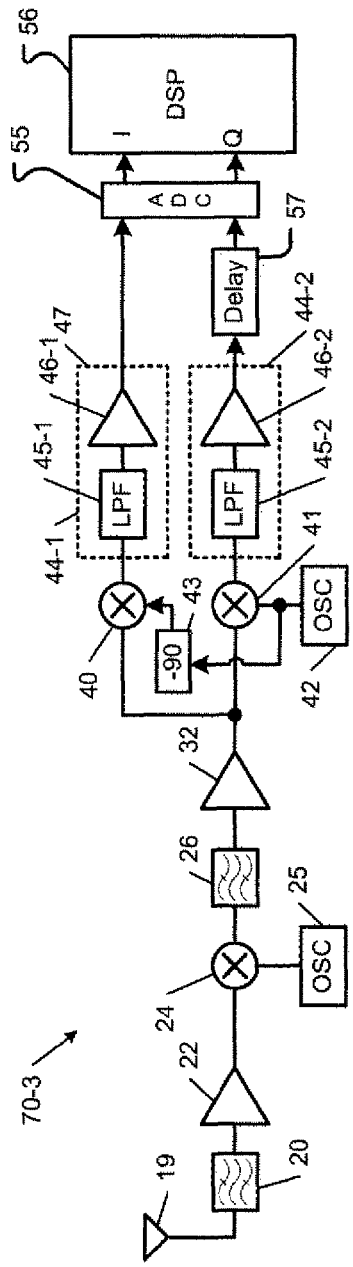
FIG. 3C is a functional block diagram of a third exemplary receiver including an analog group delay equalizer according to the present disclosure.
Figure 3E:
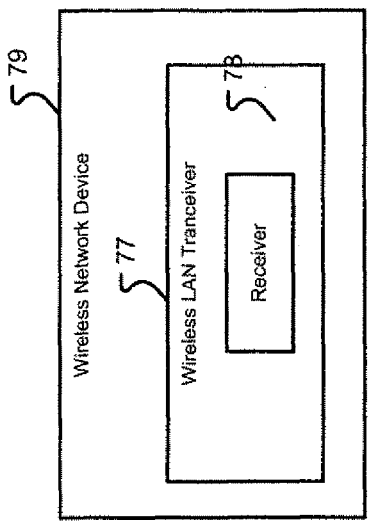
FIG. 3E is a functional block diagram of the receivers of FIGS. 3A-3D in a wireless transceiver of a wireless network device.
Figure 3D:
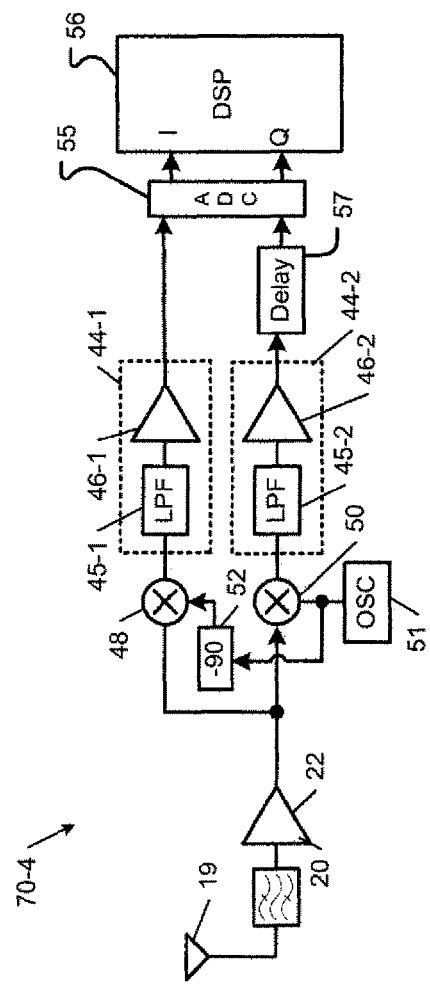
FIG. 3D is a functional block diagram of a fourth exemplary receiver including a analog group delay equalizer according to the present disclosure.

Referring now to FIGS. 3C and 3D, exemplary receivers 70-3 and 70-4 according to the present disclosure are shown. An analog group delay equalizer circuit 57 may be inserted into one of the I and Q signal paths to align the timing of the I and Q signals. A pipelined analog to digital converter 55 converts the analog I and Q signals to digital I and Q signals, which are input to the DSP 56. As can be appreciated, the digital interpolator 54 in FIGS. 3A and 3B tends to consume less power and less area than the analog group delay equalizer 57 of FIGS. 3C and 3D.

Referring now to FIG. 3E, receivers 77 such as those illustrated in FIGS. 3A-3D may be implemented in a wireless local area network transceiver 78 of a wireless network device 79. The wireless network device 79 may be compliant with I.E.E.E. standards 802.11, 802.11a, 802.11b, 802.11g, 802.11h, 802.11n, 802.16, and 802.20, which are hereby incorporated by reference in their entirety. The wireless network device may also be compliant with Bluetooth. The receivers 77 may form part of a physical layer (PHY) module.

Figure 4A:
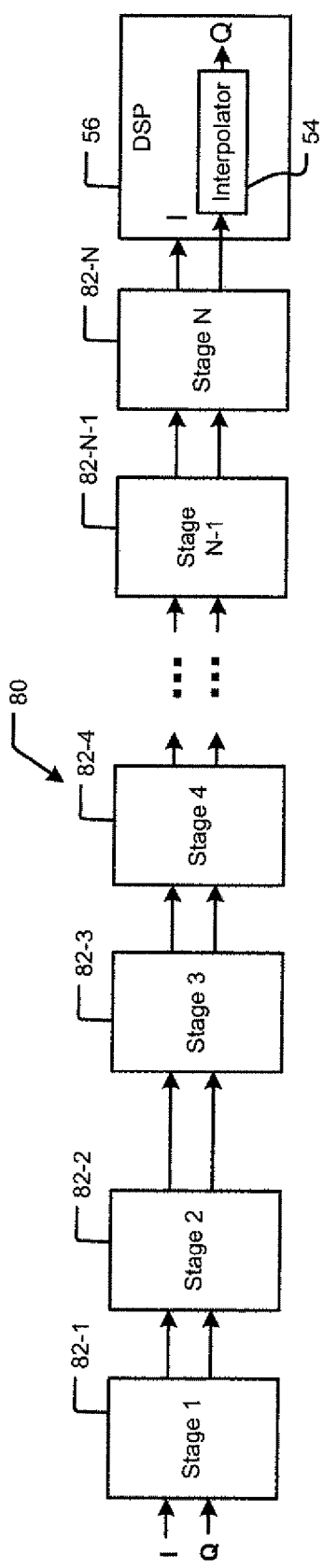
FIG. 4A is a functional block diagram illustrating operation of the analog to digital converter of FIGS. 3A and 3B.
Figure 4B:
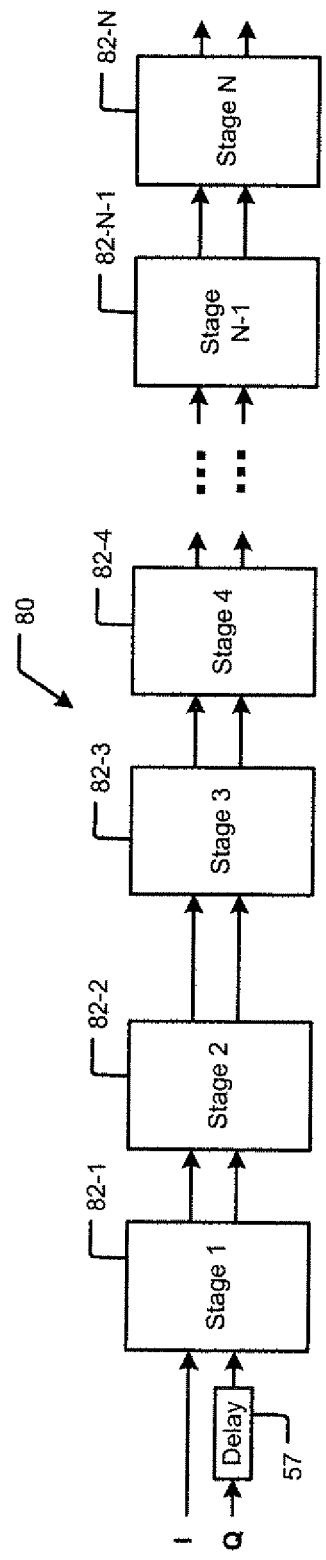
FIG. 4B is a functional block diagram illustrating operation of the analog to digital converter of FIGS. 3C and 3D.
Figure 4C:
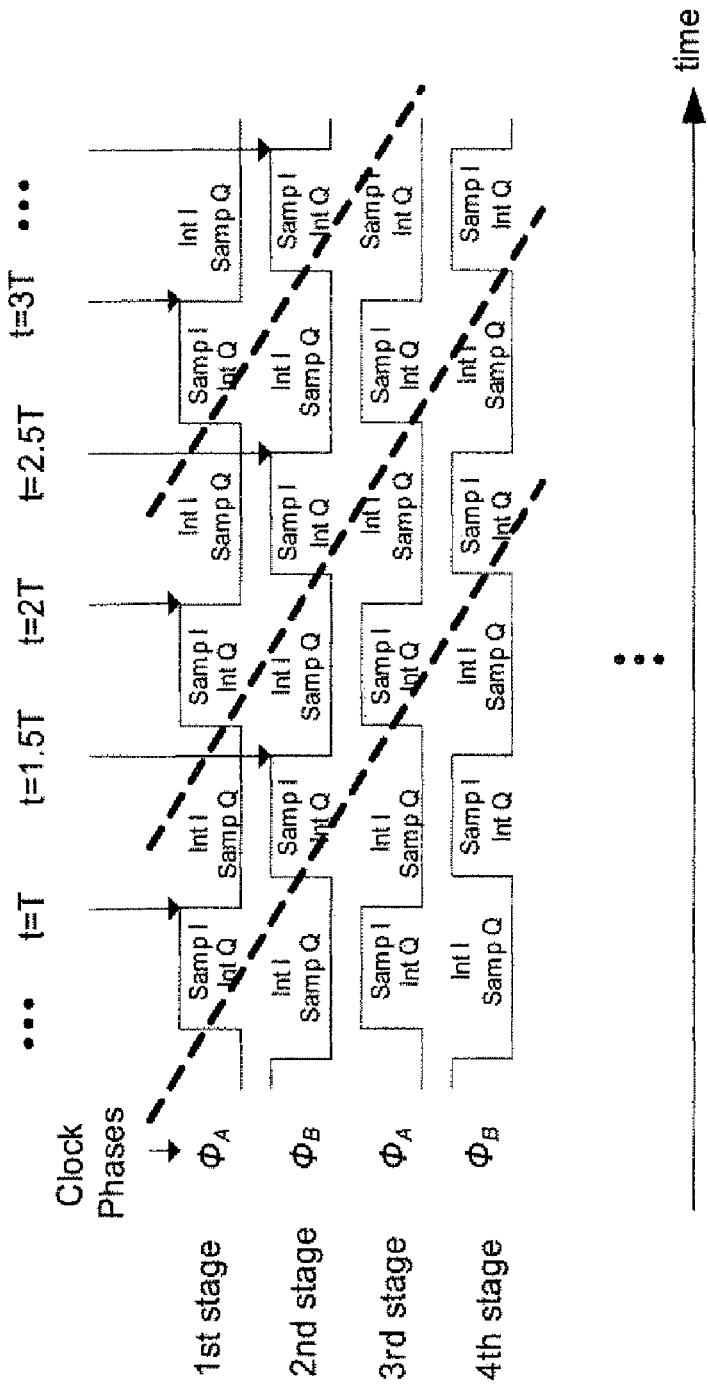
FIG. 4C is a timing diagram for the analog to digital converters of FIGS. 3C and 3D.

Referring now to FIGS. 4A, 4B and 4C, interconnection and timing of stages of a pipelined analog to digital converter is shown. In FIG. 4A, the pipeline analog to digital converter 80 includes stages 82-1, 82-2, . . . , and 82-N (collectively stages 82). Each stage 82 includes sample and integrate circuit. The circuit is shared by the I and Q signal paths as will be described further below. For example, the first stage 82-1 samples I and integrates Q in a first portion of the clock phase A and integrates I and samples Q in a second portion of clock phase A. The subsequent stage 82-2 integrates I and samples Q in a first portion of the clock phase B and samples I and integrates Q in a second portion of clock phase B. Additional pairs of stages 82 repeat this pattern.

The digital interpolator 54 in the DSP 52 may be used to adjust for the phase offset caused by the shared arrangement. In FIG. 4B, the analog group delay equalizer 57 may be used to adjust for the phase offset caused by the shared arrangement. Referring now to FIG. 4C, timing of adjacent stages is shown. One stage samples I and integrates Q in a first portion of clock phase A and integrates I and samples Q in a second portion of the clock phase A. The adjacent stage integrates I and samples Q in a first portion of the clock phase B and samples I and integrates Q in a second portion of the clock phase B. The first portion of the clock phase A may be concurrent with the first portion of clock phase B.

Figure 5A:
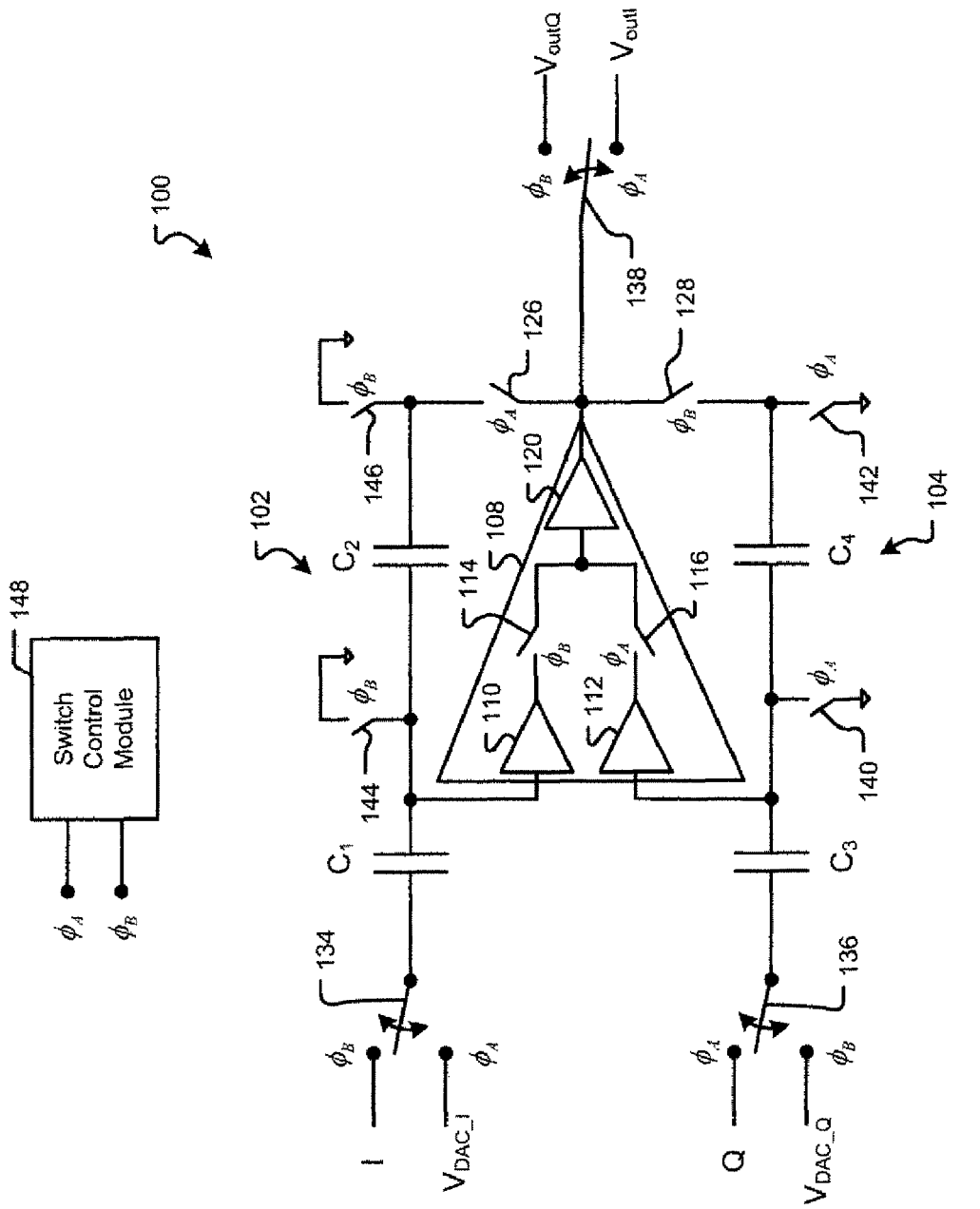
FIG. 5A is an electrical schematic of a first exemplary sample and integrate circuit.

Referring now to FIG. 5A, a first exemplary sample and integrate circuit 100 is shown. The sample and integrate circuit 100 includes first and second portions 102 and 104 that include capacitors C1 and C2 and C3 and C4, respectively. The capacitors C1 and C2 and C3 and C4 are connected in series. An amplifier 108 may include first and second inputs that are connected between capacitors C1 and C2 and C3 and C4, respectively. The amplifier 108 includes first and second amplifiers 110 and 112 that have outputs that are connected by switches 114 and 116, respectively, to an amplifier 120. One end of the capacitor C2 is connected by a switch 126 to an output of the amplifier 120. One end of the capacitor C4 is connected by a switch 128 to an output of the amplifier 120.

A switch 134 selectively connects the capacitor C1 to the in-phase component in a first half of clock phase A for sampling the input signal and then to the D/A converter output in a second half of the clock phase A to subtract the quantized signal from the input signal. Then, the amplified residual voltage of the in-phase component is available at the VOUT_I for the next stage to sample. A switch 136 selectively connects the capacitor C3 to the quadrature-phase component in a second half of clock phase B for sampling the input signal and then to the D/A converter output in a first half of the clock phase B to subtract the quantized signal from the input signal. Then, the amplified residual voltage of the quadrature-phase component is available at the VOUT_Q for the next stage to sample.

Switches 140, 142, 144 and 146 selectively ground capacitors C3, C4, C1 and C2, respectively. A switch control module 148 selectively controls the switches and the circuit 100. Switches are closed depending upon clock phases $\Phi_A$ and $\Phi_B$ as indicated in FIG. 5A. The clock phases and may be non-overlapping. The clock phases $\Phi_A$ and $\Phi_B$ may be out of phase by 180 degrees.

Figure 5B:
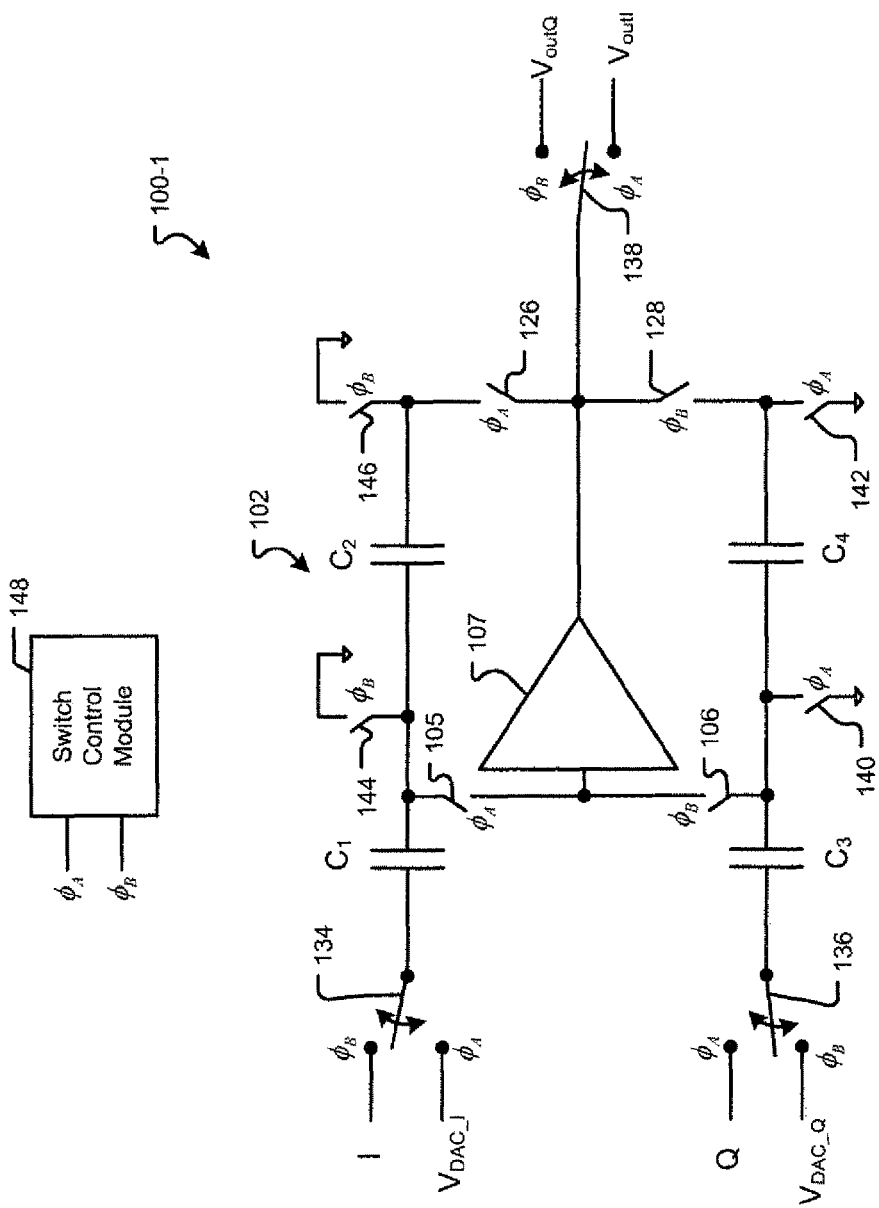
FIG. 5B is an electrical schematic of a second exemplary sample and integrate circuit.

Referring now to FIG. 5B, a second exemplary sample and integrate circuit 100-1 is shown. An input of an amplifier 107 may be switched using switches 105 and 106. Otherwise operation is similar to that described above.

Figure 6:
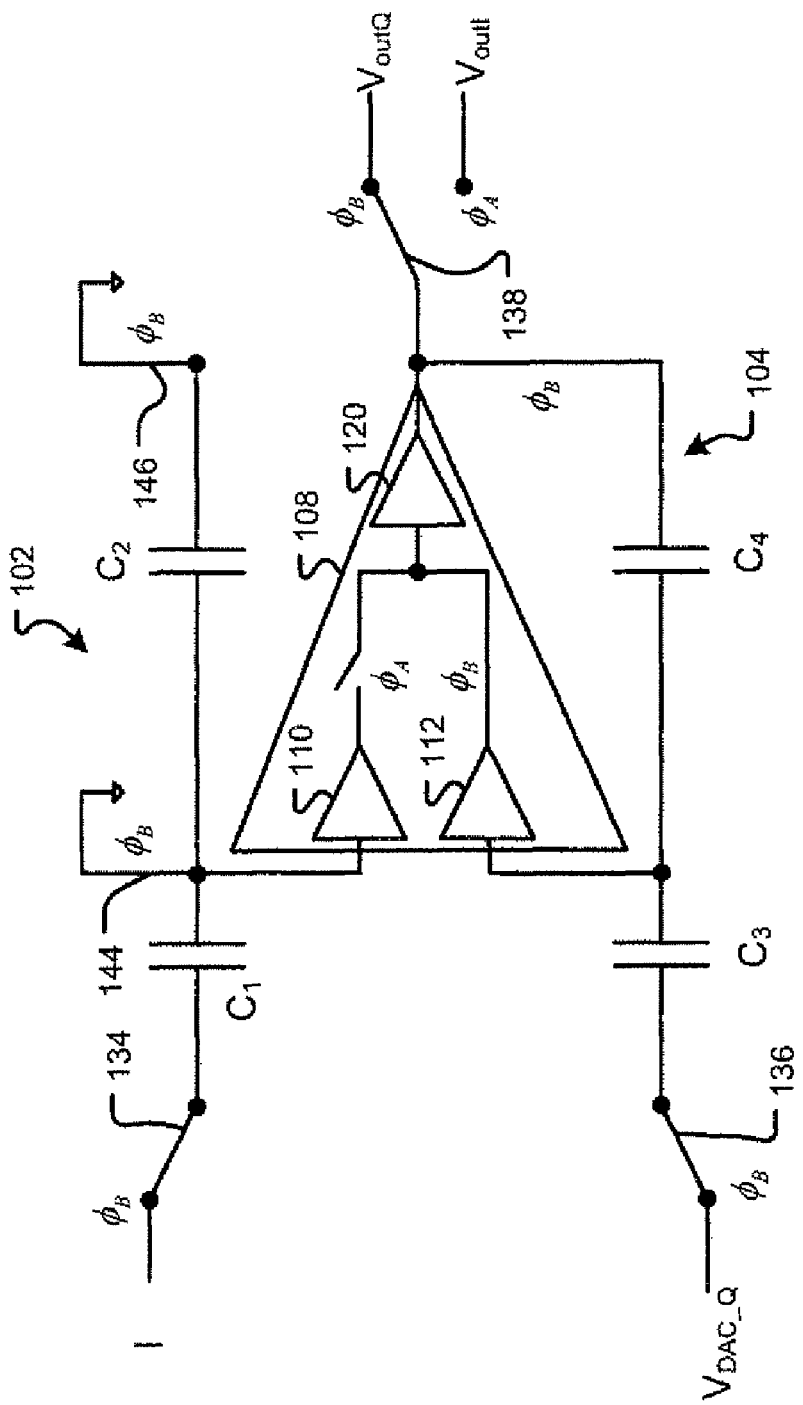
FIG. 6 is an electrical schematic of the circuit in FIG. 3A operating in a first phase.
Figure 7:
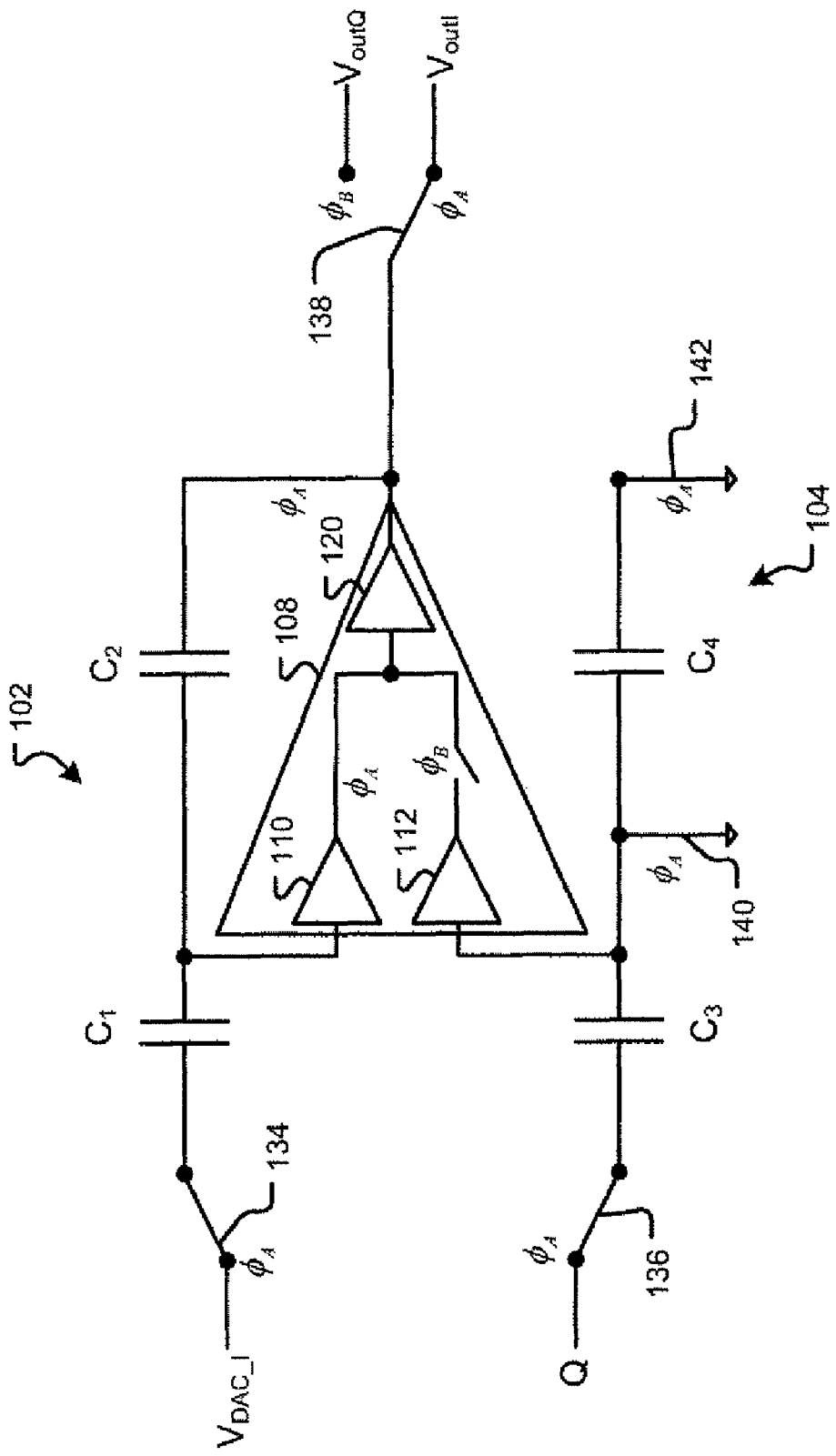
FIG. 7 is an electrical schematic of the circuit of FIG. 3A operating in a second phase.

Referring now to FIGS. 6 and 7, the circuit in FIG. 5A is shown when $\Phi_B$ has a first or high state. In this position, the upper portion 102 samples the in-phase component I and the lower portion 104 integrates a sampled quadrature component Q. In FIG. 7, the circuit of FIG. 5A is shown when $\Phi_A$ has first or high state. In this position, the upper portion 102 integrates the in-phase component and samples the quadrature component.

As can be appreciated from the foregoing, the amplifiers 107 and 108 can be shared by I and Q paths. While the foregoing description involves a sample and integrate circuit, a similar approach can be used with a sample and hold circuit as well. Power consumption of the device may be decreased significantly through the shared use of the amplifiers.

Figure 1B:
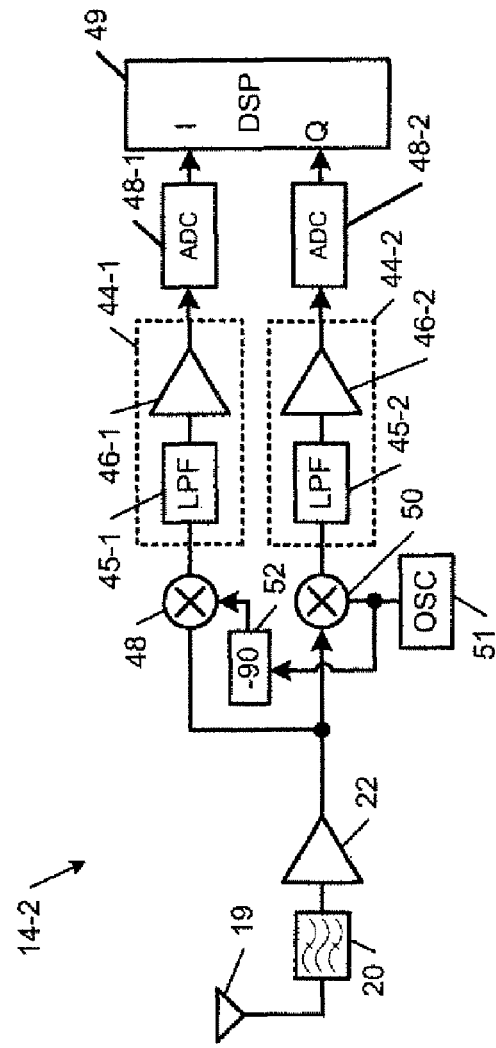
FIG. 1B is a functional block diagram of a second exemplary receiver according to the prior art.
Figure 2:
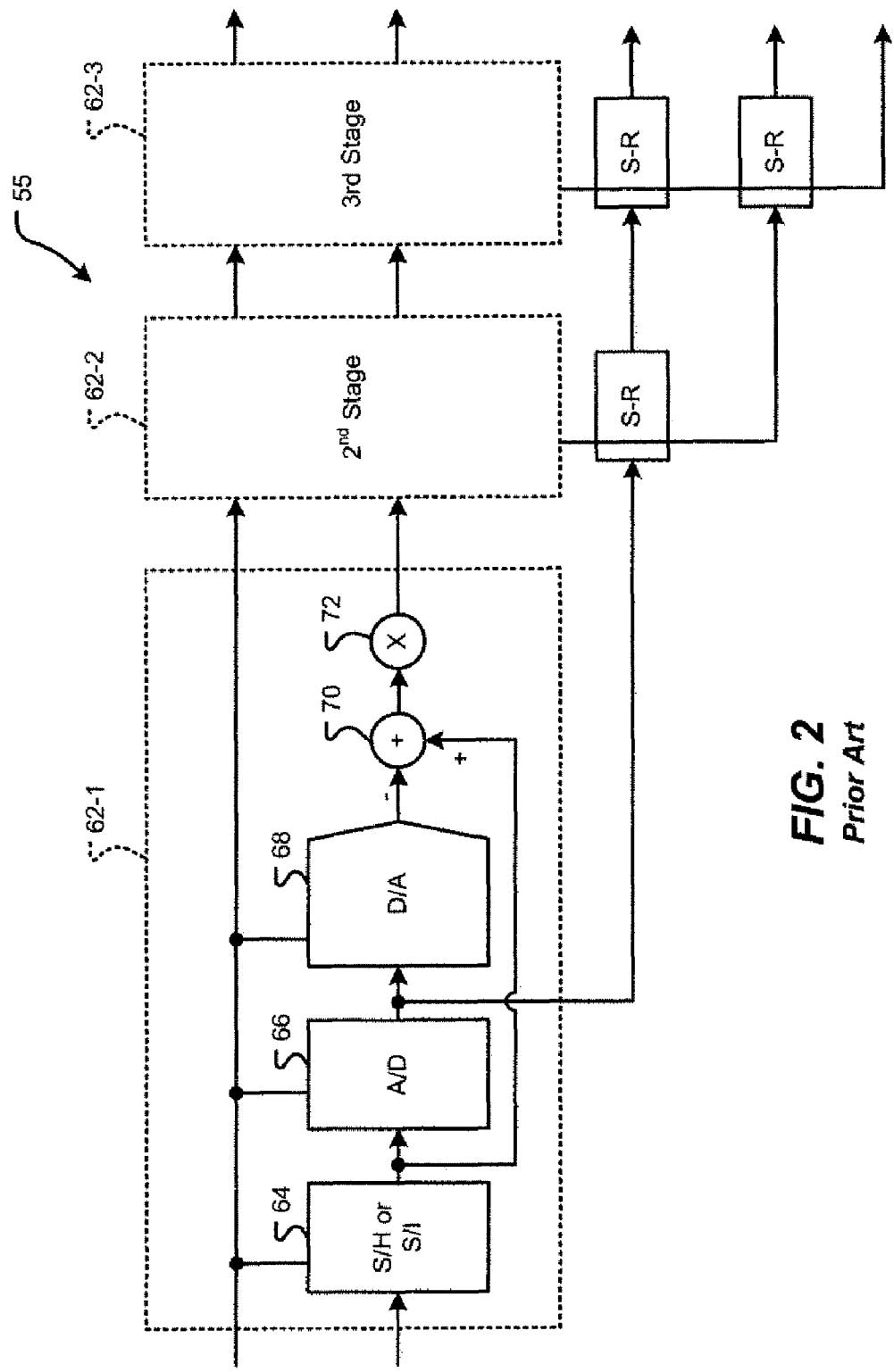
FIG. 2 is a functional block diagram of a pipelined analog to digital converter according to the prior art.

As can be appreciated, the ADC described above can be used in the wireless receivers shown in FIGS. 1A and 1B. The ADC according to the present disclosure tends to reduce power consumption by sharing of the opamps for both the I and Q paths as previously described above.

Figure 8B:
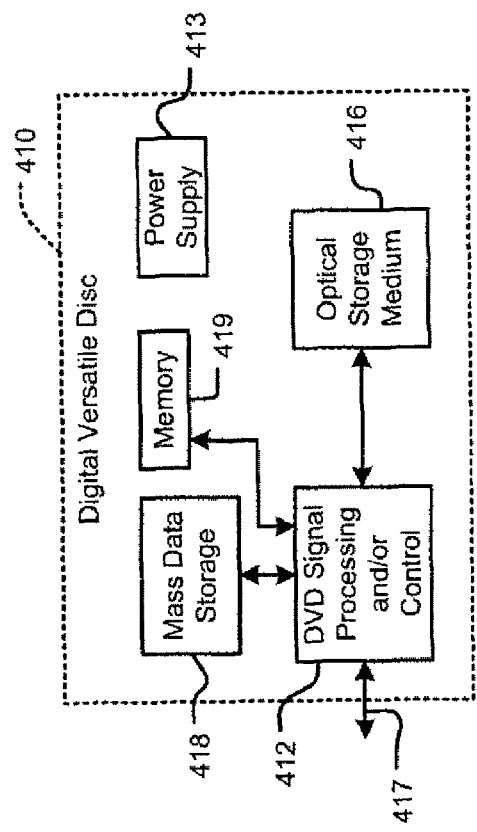
FIG. 8B is a functional block diagram of a digital versatile disk (DVD)
Figure 8A:
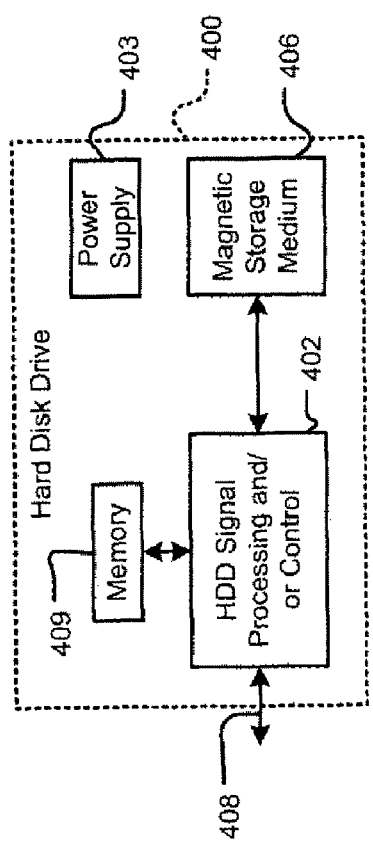
FIG. 8A is a functional block diagram of a hard disk drive.

Referring now to FIGS. 8A-8G, various exemplary implementations of the device are shown. Referring now to FIG. 8A, the device can be implemented in analog to digital converters in a hard disk drive 400. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 8B, the device can be implemented in analog to digital converters in a digital versatile disc (DVD) drive 410. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 8A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figures 8C, 8D:
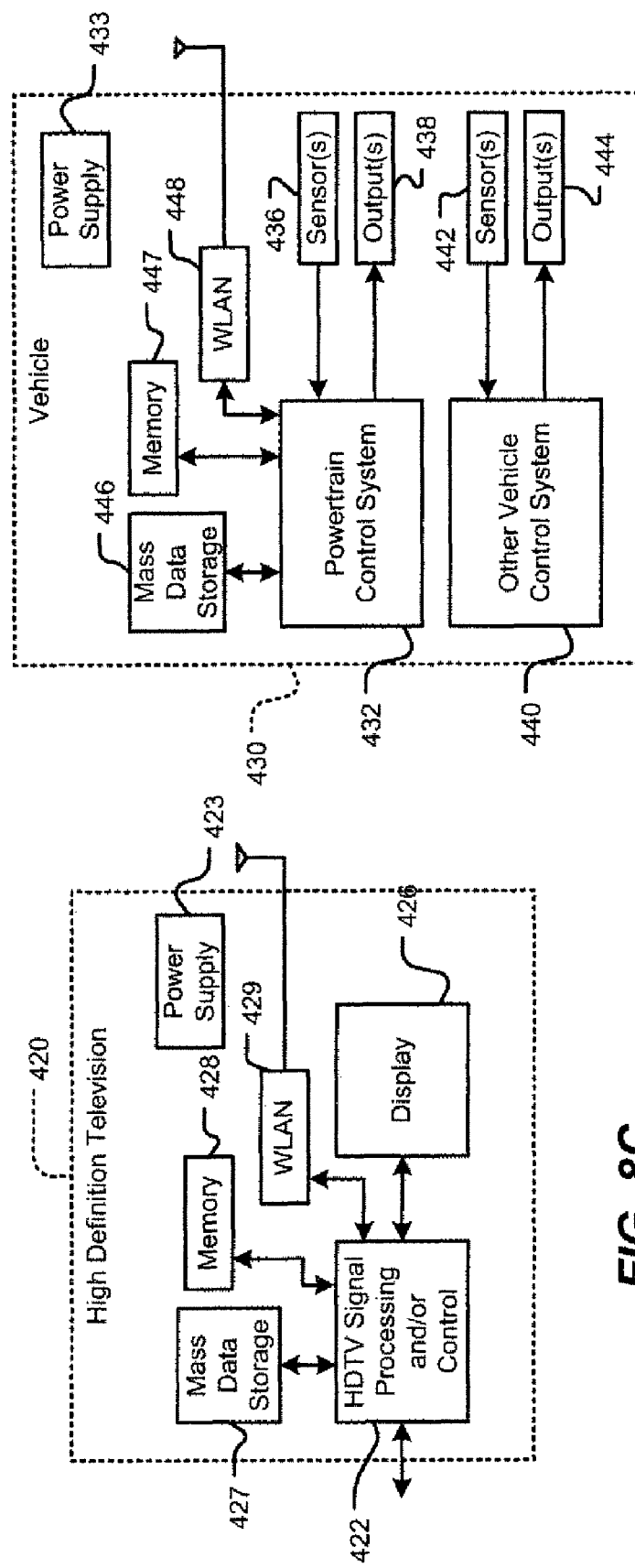
FIG. 8C is a functional block diagram of a high definition television.
FIG. 8D is a functional block diagram of a vehicle control system.

Referring now to FIG. 8C, the device can be implemented in analog to digital converters of a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 8A and/or at least one DVD may have the configuration shown in FIG. 8B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 8D, the device may implement and/or be implemented in analog to digital converters in a control system of a vehicle 430. In some implementations, the powertrain control system 432 receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The device may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 8A and/or at least one DVD may have the configuration shown in FIG. 5B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 8E:
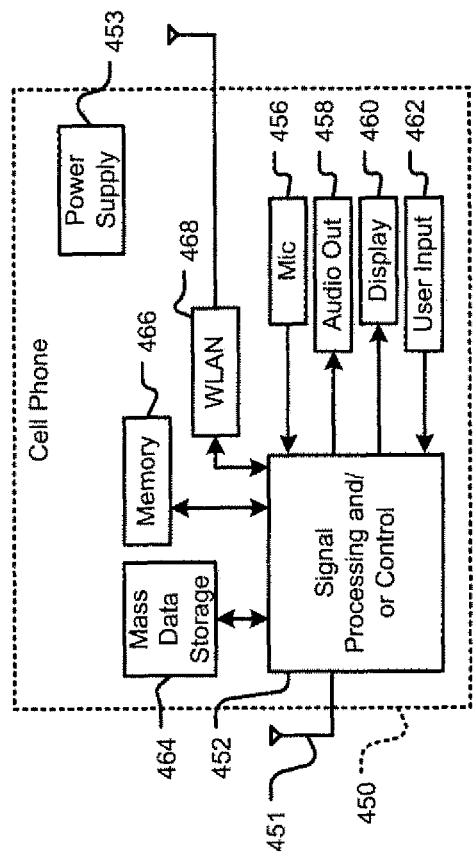
FIG. 8F is a functional block diagram of a set top box.
FIG. 8G is a functional block diagram of a media player.

Referring now to FIG. 8E, the device can be implemented in analog to digital converters in a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 8F:
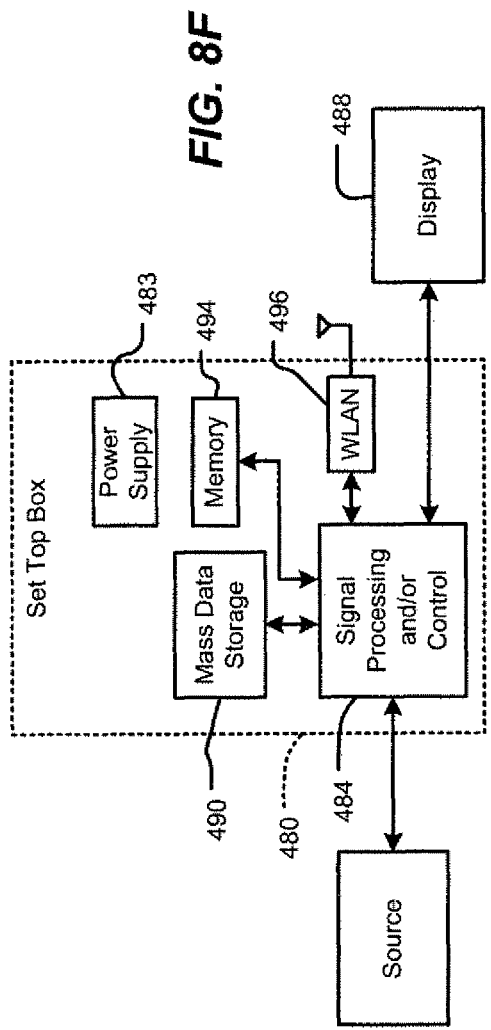

Referring now to FIG. 8F, the device can be implemented in analog to digital converters in a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 8G:
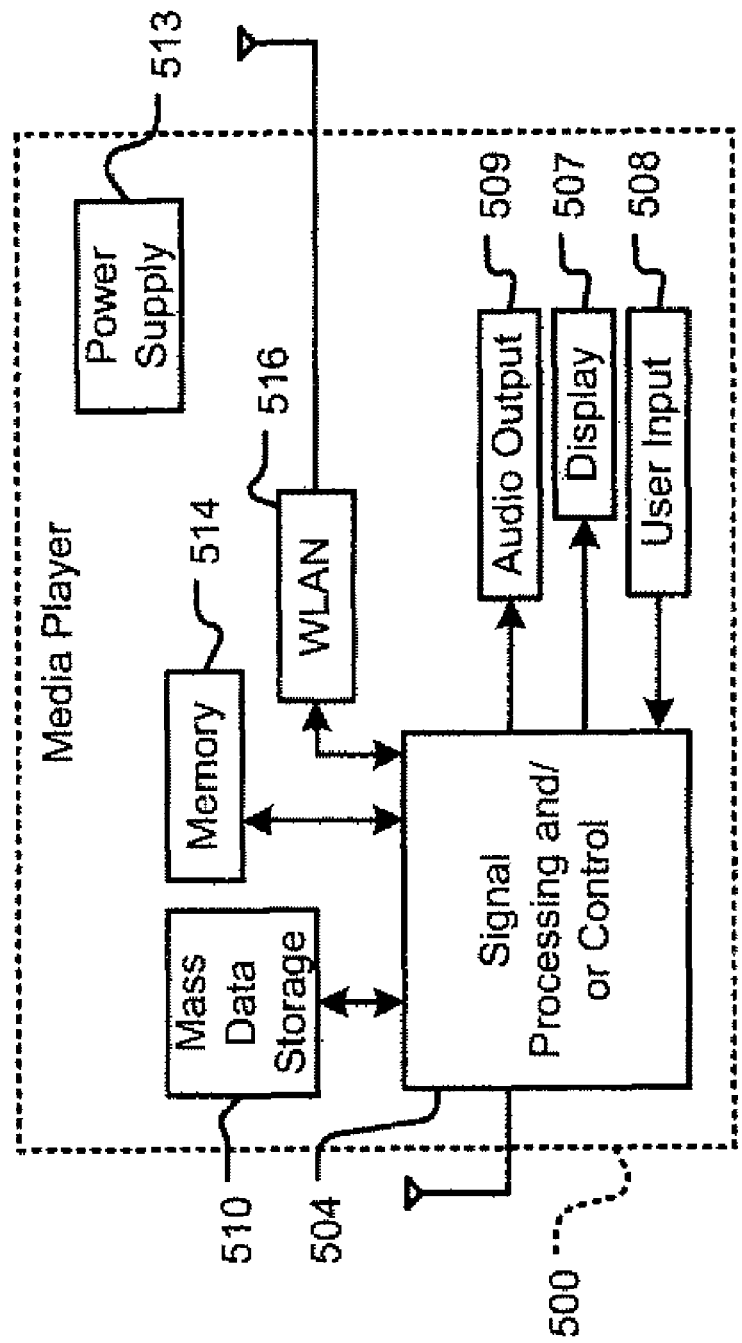

Referring now to FIG. 8G, the device can be implemented in analog to digital converters of a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A pipelined analog to digital converter comprising:
   a first stage configured to (i) receive a first phase component and a second phase component and (ii) generate a first integrated component and a second integrated component; and
   a second stage configured to sample and integrate the first integrated component and the second integrated component,
   wherein the first stage is configured to
   sample the first phase component to generate a first sampled component,
   sample the second phase component to generate a second sampled component, during a first portion of a first clock phase of the first stage, (i) sample the first phase component and (ii) integrate the second sampled component to generate the second integrated component, and during a second portion of the first clock phase, (i) sample the second phase component and (ii) integrate the first sampled component to generate the first integrated component.

2. The pipelined analog to digital converter of claim 1, wherein the second stage is configured to:

sample the first integrated component to generate a first sampled component;

sample the second integrated component to generate a second sampled component;

during a first portion of a second clock phase, (i) sample the first integrated component generated by the first stage and (ii) integrate the second integrated component generated by the first stage to generate a second integrated component; and during a second portion of the second clock phase, (i) sample the second integrated component generated by the first stage and (ii) integrate the first integrated component generated by the first stage to generate a first integrated component.

3. The pipelined analog to digital converter of claim 2, wherein the second clock phase is 180° out-of-phase from the first clock phase.

4. The pipelined analog to digital converter of claim 3, further comprising a third stage configured to sample and integrate (i) the first integrated component generated by the second stage and (ii) the second integrated component generated by the second stage.

5. The pipelined analog to digital converter of claim 4, wherein the third stage is configured to:

sample the first integrated component generated by the second stage to generate a first sampled component;

sample the second integrated component generated by the second stage to generate a second sampled component;

during a first portion of a first clock phase, (i) sample the first integrated component generated by the second stage and (ii) integrate the second integrated component generated by the second stage to generate a second integrated component; and during a second portion of the first clock phase, (i) sample the second integrated component generated by the second stage and (ii) integrate the first integrated component generated by the second stage to generate a first integrated component.

6. The pipelined analog to digital converter of claim 5, wherein:

the first phase component includes an in-phase component; and the second phase component includes a quadrature component.

7. The pipelined analog to digital converter of claim 1, wherein:

the first phase component includes an in-phase component; and the second phase component includes a quadrature component.

8. The pipelined analog to digital converter of claim 1, wherein the first stage comprises:

a first capacitance configured to receive the first phase component;

a second capacitance connected in series with the first capacitance;

a third capacitance configured to receive the second phase component;

a fourth capacitance connected in series with the third capacitance; and an amplifier module connected to the first capacitance, the second capacitance, the third capacitance, and the fourth capacitance.

9. The pipelined analog to digital converter of claim 8, further comprising:

a first switch configured to provide (i) the first phase component to the first capacitance when in a first state and (ii) provide a sampled and analog version of the first phase component to the first capacitance when in a second state; and a second switch configured to provide (i) the second phase component to the third capacitance when in a first state and (ii) provide a sampled and analog version of the second phase component to the third capacitance when in a second state.

10. The pipelined analog to digital converter of claim 8, wherein the amplifier module comprises:

a first amplifier connected to the first capacitance and the second capacitance;

a second amplifier connected to the third capacitance and the fourth capacitance;

a first switch that is connected to the first amplifier;

a second switch that is connected to the second amplifier; and a third amplifier that is connected to the first switch and the second switch.

11. The pipelined analog to digital converter of claim 10, wherein the third amplifier comprises an output, wherein the output is connected to the second capacitance and the fourth capacitance.

12. The pipelined analog to digital converter of claim 11, wherein:

the first integrated component is provided at the output when the first switch is in a closed state and the second switch is in an open state; and the second integrated component is provided at the output when the second switch is in a closed state and the first switch is in an open state.

13. The pipelined analog to digital converter of claim 8, further comprising:

a first switch connected to the first capacitance and the second capacitance; and a second switch connected to the third capacitance and the fourth capacitance, wherein the amplifier module connected to the first switch and the second switch.

14. The pipelined analog to digital converter of claim 8, further comprising:

a first switch configured to connect the second capacitance to an output of the amplifier module; and a second switch configured to connect the fourth capacitance to the output of the amplifier module.

15. The pipelined analog to digital converter of claim 14, further comprising a third switch connected between the first stage and the second stage and configured to provide (i) the first integrated component from the first stage to the second stage when in a first state and (ii) the second integrated component from the first stage to the second stage when in a second state.

16. The pipelined analog to digital converter of claim 14, further comprising:

a fourth switch connected between the first switch and an input of the amplifier module; and a fifth switch connected between the second switch and the input of the amplifier module.

17. The pipelined analog to digital converter of claim 8, further comprising a plurality of switches that are configured to connect ends of the first capacitance, the second capacitance, the third capacitance and the fourth capacitance to a voltage reference.

18. A device comprising:
the pipelined analog to digital converter of claim 1;
a first baseband circuit configured to generate the first phase component; and
a second baseband circuit configured to generate the second phase component.

19. The device of claim 18, further comprising:
an analog delay circuit configured to delay one of the first phase component and the second phase component; and
a processor configured in communication with the pipelined analog to digital converter and the analog delay circuit.

20. A device comprising:
the pipelined analog to digital converter of claim 1; and
a digital signal processor configured to receive an output of the pipelined analog to digital converter, wherein the digital signal processor comprises an interpolator configured to receive the output of the pipelined analog to digital converter.

* * * * *